United States Patent [19]

Melgara et al.

[11] Patent Number: 4,823,307
[45] Date of Patent: Apr. 18, 1989

[54] MOS SELFCHECKING MICROPROGRAMMED CONTROL UNIT WITH ON-LINE ERROR DETECTION

[75] Inventors: Marcello Melgara; Maurizio Paolini, both of Valenza; Maura Turolla, Torino, all of Italy

[73] Assignee: Cselt - Centro Studi e Laboratori Telecomunicazioni S.P.A., Italy

[21] Appl. No.: 839,114

[22] Filed: Mar. 12, 1986

[30] Foreign Application Priority Data

Mar. 25, 1985 [IT] Italy ................................ 67285 A/85

[51] Int. Cl.⁴ ........................ G06F 11/28; G06F 9/00; G06F 7/02
[52] U.S. Cl. .................................. 364/900; 364/200; 371/19; 371/16
[58] Field of Search ... 364/200 MS File, 900 MS File; 371/16, 19, 21, 67

[56] References Cited

U.S. PATENT DOCUMENTS

| | | | |
|---|---|---|---|
| 3,599,091 | 8/1971 | Warner, Jr. ........................... | 324/73 |
| 4,003,033 | 1/1977 | O'Keefe et al. ...................... | 364/280 |
| 4,057,847 | 11/1977 | Lowell et al. ....................... | 364/200 |
| 4,312,066 | 1/1982 | Bantz et al. ........................ | 371/16 |
| 4,392,208 | 7/1983 | Burrows et al. ..................... | 364/900 |

Primary Examiner—Gareth D. Shaw
Assistant Examiner—Christina M. Eakman
Attorney, Agent, or Firm—Herbert Dubno

[57] ABSTRACT

The control unit detects the errors concurrently with normal microinstruction execution through suitable internal checking circuits and a determined microinstruction allocation in the memory. Microinstructions comprise additional fields (CS, FS) carrying the encoding, in Modified Berger code, of the allocation address of the microinstruction itself and of the following one. The microinstructions of destination of conditional jumps are allocated so that their codes are related to each other by simple logic relationships which are then reproduced by an internal circuit (CSM). The two fields, the one of the next microinstruction being duly delayed, are then compared and possible differences represent unidirectional and incorrect sequencing errors. The other errors are detected through particular implementations of some internal circuits (STK1, INC1) and duplication of others (RCT, SEL).

9 Claims, 6 Drawing Sheets

FIG.1

PRIOR ART

MOS SELFCHECKING MICROPROGRAMMED CONTROL UNIT WITH ON-LINE ERROR DETECTION

FIELD OF THE INVENTION

The present invention relates to microprogrammable electronic systems and, more particularly, to a self-checking microprogram control unit (MCU) with on-line error detection capability, in MOS technology.

BACKGROUND OF THE INVENTION

A microprogram control unit is said self-checking when capable of detecting and signalling to the outside the occurrence of an error inside it. It is said to be self-checking with on-line error-detection capability, if it can detect and signal the errors concurrently with its ordinary operation, without requiring specific periodical execution of self-checking programs.

Self-checking control units already known in the art usually have the disadvantage that their capacity to detect possible errors requires too high circuit complexity.

Said units differ from one another as to the approach used for error detection.

A known type of self-checking control unit, as described for example, in the paper "*Design of concurrently testable microprogrammed control units*" by M. Namjoo, *Proceedings of the MICRO-15 Workshop*, Palo Alto, Calif., July 1982, follows a functional error-detection approach which checks the correct microinstruction sequencing.

Namely, microinstruction transitions are checked, by assigning a check symbol to each microinstruction.

This check symbol is randomly generated independently of the microinstruction address. Its correctness is then checked. This approach has the following disadvantages:

complete sequencing error coverage cannot be ensured without associating a different symbol with each microinstruction, which is equivalent to adding two address fields to the microinstruction, thereby effecting a considerable increase in the microprogram memory and internal buses; and even doubling of the microinstruction length does not allow checking of the correct correspondence between the destination of a condition jump and the value of the condition logic variable. In case of an error in the condition logic variable, the jump destination will be incorrect without possibility of error detection, thereby introducing sequencing errors among microinstructions.

Another known type of self-checking control unit, described for example, in the paper entitled "*The design of a microprogram control unit with concurrent error detection*" by C. Yu Wong, et al., *Proceedings of the 13th International Symposium on Fault-Tolerant Computing*, Milan, June 1983, follows an analytical error detection approach based on the use of an error model strictly correlated with the technology used.

For instance, in MOS technology, a unidirectional error model is used. A unidirectional error is a multiple or single error which may affect one or more positions in a word such that all the erroneous positions assume the same logic level.

Unidirectional errors are detected by introducing an additional field into the microinstruction containing the Berger code of the microinstruction address. This code is then compared during the microinstruction execution with the code logically regenerated by a suitable circuit; a possible difference indicates the error. The Berger code is the binary coding of the number of zeroes contained in the field to be coded.

Conversely, the failures which do not give rise to unidirectional error are covered by using the duplication of the relevant circuit parts of the unit. Besides the expense in terms of the number of components needed, the duplication technique is incapable of covering the failures on the carry lines of the computing elements and on the data lines beyond the branching points of the internal buses, since the error checks are carried out by using the Berger coding, which is extracted from the first copy of the datum, sent into the bus together with the second copy, and compared at the bus end with the code here extracted from the second copy. Thus only unidirectional errors are covered, and hence the duplication in this case is useless.

SUMMARY OF THE INVENTION

These problems are solved by the present invention which comprises a self-checking microprogram control unit with on-line error detection capability wherein two control words which are not randomly generated with each microinstruction are associated, the control words being modified Berger code encoding of the addresses of said microinstruction and of the subsequent one. The microinstructions which are destination of conditional jumps are allocated in such memory positions that the encoding of their addresses are related to each other by simple logic relationships which are then reproduced in the unit itself by a suitable circuit. Thus, through a suitable internal checking circuit, which compares these two codes, unidirectional and incorrect sequencing errors are detected.

To overcome the arithmetical errors caused by failures on the carry lines, the microprogram incrementer is realized in such a way that said errors propagate on the carry lines to the outside so as to carry an error signalling. The counter register is duplicated, and the two outputs are not compared with each other, one used at two different points of the unit so as to generate, in case of difference, a sequencing error detectable as described.

In addition, the internal-bus lines of the unit are checked beyond the branch points at the end of their paths by suitable checking circuits, detecting also failures which might occur on branching lines and which would be otherwise undetectable.

The invention thus provides a selfchecking microprogram-control unit (MCU) with on-line error detection in MOS technology, comprising:

a microinstruction memory (MIM1) of the type which, in case of failure, generates only unidirectional errors at the outputs, connected to a microinstruction register (MIM1);

a register counter (RCT), a condition selector (SEL) and a control signal generator (DSC1) connected to the microinstruction register, the generator (DSC1) being of the programmed logic array type which, in case of failure, generates only unidirectional errors at the outputs;

a microprogram counter comprising an incrementer (INC1) and a register (MPR1); and a temporary memory (STK) of stack-point addresses of the main instruction sequence.

According to the invention, each microinstruction comprises two further fields containing a current address code (CS) of the position in the microinstruction memory (MIM1) wherein the microinstruction is physically contained, and a future address code (FS) of the position wherein the next microinstruction of the microprogram is physically contained. Conditional-jump destination microinstructions are allocated in memory positions such that their codes are related to each other by simple logic relationships. The current address code (CS) is compared with the future address code (FS), delayed by a microinstruction time and present in the preceding microinstruction possibly modified by the simple logic relationships, and in case of a discrepancy a first error indication (ER2) is emitted. The register counter and condition selector are duplicated (RCT1, RCT2, SEL1, SEL2), the output of a selector determining the choice of the simple logic relationships, and the output of the other selector being usually connected to the control signal generator, the incrementer, in case of failures on the address inputs, generates only unidirectional errors on the address outputs, while in case of arithmetical errors interesting also internal carry signals, it propogates said errors in internal carry lines up to an error output on which it emits a second error indication (ER3).

The temporary address memory (STK1) is crossed by control signals it receives from control signal generator (DSC1) and which are carried to a first selfchecking equality checker (VA1) which, in case of failures of said control signals, emits a third error indication (ER4).

A selfchecking microinstruction checker (CCK1) generates a microinstruction code based on the words present on the buses arriving from microinstruction register (MIR1) and traversing the register counters (RCT1, RCT2), the condition selectors (SEL1, SEL2) and the control signal generator (DSC1), and comparing it with a microinstruction code present in the microinstruction itself and, in case of discrepancy, emitting a fourth error signal (ER1).

BRIEF DESCRIPTION OF THE DRAWING

The characteristics of the present invention will become clearer from the following description of a preferred, but not limiting embodiment thereof, with reference to the accompanying drawing in which.

SPECIFIC DESCRIPTION

Figure 1:
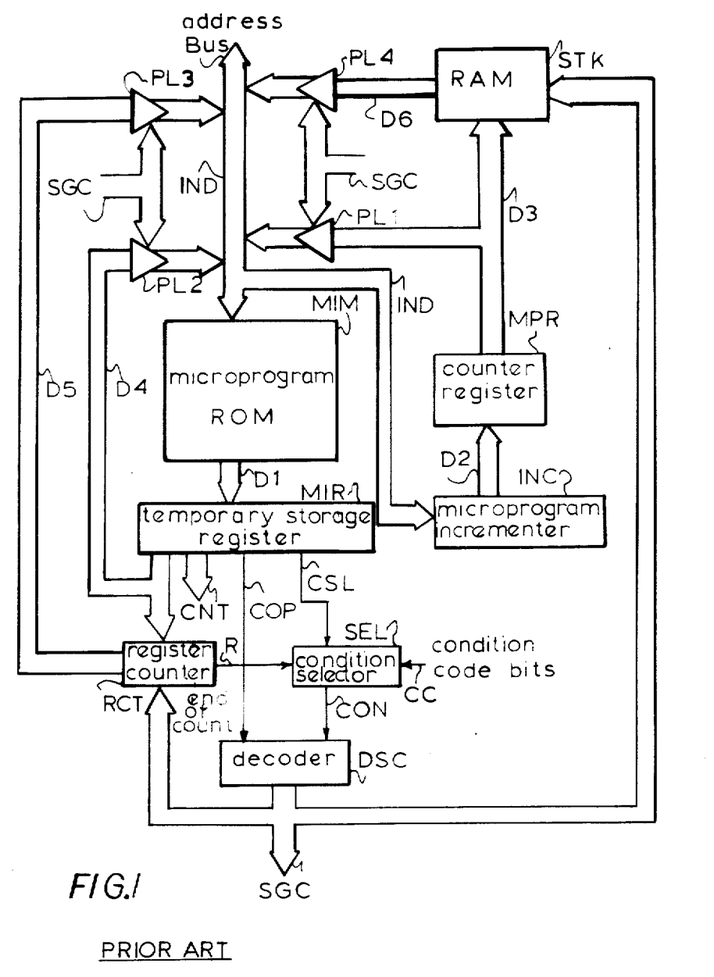
FIG. 1 is a the block diagram of a known microprogram control unit in MOS technology without self-checking capability.

In FIG. 1 the block MIM is a microprogram ROM memory containing the sequence of microinstructions, read by addressing supplied on the address bus IND.

The block MIR is a register for the temporary storage of the microinstructions supplied by MIM through bus D1; MIR supplies to bus D4 the adresses and/or the data contained in the microinstructions, to bus CNT the control signals of the external operating unit, to connection COP the operative code bits, and to connection CSL the bits of a condition selecting code.

The block is a condition selector and can be an ordinary multiplexer.

Block SEL receives on connection CC condition code bits coming from the outside and on wire R an end-of-court bit; dependent on the logic level of condition selection code bits, on connection CSL applied to control input, block SEL supplies on wire CON one of the condition bits present on connection CSL or that on wire R.

A block DSC is a decoder decoding the operative code present on connection COP and the condition bit of wire CON, and generating control signals emitted on bus SGC towards other control unit blocks.

Decoder DSC is usually implemented by a two-level programmed logic network, the first level consisting of a plane or matrix of AND gates and the second level consisting of a plane or matrix of OR gates, known in the technique by the acronym PLA (Programmable Logic Array).

The circuits INC and MPR are, respectively the microprogram incrementer and a counter register.

The microcomputer increments INC determines the loading into the counter register MPR, through bus D2, of the address present on bus IND incremented by a unit.

The register MPR sends onto bus D3 the address coming from microprogram incrementer INC and stored inside it.

The block STK is a RAM memory, capable of temporarily storing a certain number of addresses coming from the microprogram implementer MPR on bus D3 and relating to the stack points of the main microinstruction sequence, temporarily abandoned for subroutine execution; the number of storable adresses determines the nesting level of the subroutines. The last written address in the random access memory STK is the first read.

The RAM STK is thus a "last-in first-out stack", and is controlled by control signals it receives on bus SGC and emits the addresses on bus D6.

A register and counter RCT has a dual function on the basis of the control signals present on bus SGC. It temporarily stores a datum present on bus D4 and afterwards sends it on again on bus D5; or it counts the number of iterations to be carried out starting from a certain number supplied to it through bus D4 until it reaches number 0 in correspondance with which it emits on wire R the end-of-count signal supplied to selector SEL.

PL1, PL2, PL3, PL4 are four common driving circuits adapted to supply on bus IND the contents of buses D3, D4, D5, D6 respectively applied to their inputs, on the basis of the logic level of the control signals present on bus SGC and generated by decoder DSC.

The operation of the control unit shown in FIG. 1 needs no further explanation since as it is generally known in the art. Integrated circuits are available on the market, carrying out microprogram control unit functions, as for example integrated circuit Am 2910, produced by AMD (Advantaced Micro Devices), whose electric diagram is functionally similar to that of FIG. 1.

In a control unit structure of the type shown in FIG. 1 the following kinds of errors are possible:

microinstruction errors: the microinstruction is liable to errors due to failures in memory MIM or in register MIR or in microinstruction transmission buses D1, D; these are unidirectional errors or errors which give rise to an incorrect microinstruction sequencing;

errors in control signals and addresses: these are unidirectional errors occurring on buses SGC, IND;

errors in block DSC which generates control signals: failures inside this block are possible which give rise to unidirectional errors at the block outputs; in the data input lines or in block SEL failures are possible which generate non-unidirectional errors the outputs of decoder DSC;

errors in microprogram counter (blocks INC, MPR): failures may occur inside the individual counter cell, which modify just that cell output giving rise to unidirectional errors; failures inside the individual cell propagating to the other cells through the carry lines, or failures on the carry lines and input data lines, which give rise to arithmetic i.e. non-unidirectional errors;

errors in register counter RCT: as in the previous case arithmetic errors are possible; besides transmission errors on data entering the register and on control signals are also possible; and errors in memory STK: failures may occur inside the memory cell which do not propagate to the others, as well as failures on the control lines causing non-unidirectional errors.

In accordance with the present invention, unidirectional errors and sequencing errors are detected by checking the correctness or transitions between microinstructions as described hereinafter.

Two fields are added to each microinstruction: the first field, referred to as the current check symbol CS, contains the encoding of the current microinstruction address; the second field, referred to as the future check symbol FS, contains the encoding of the address of the subsequent microinstruction in the microprogram sequence.

Figure 2:
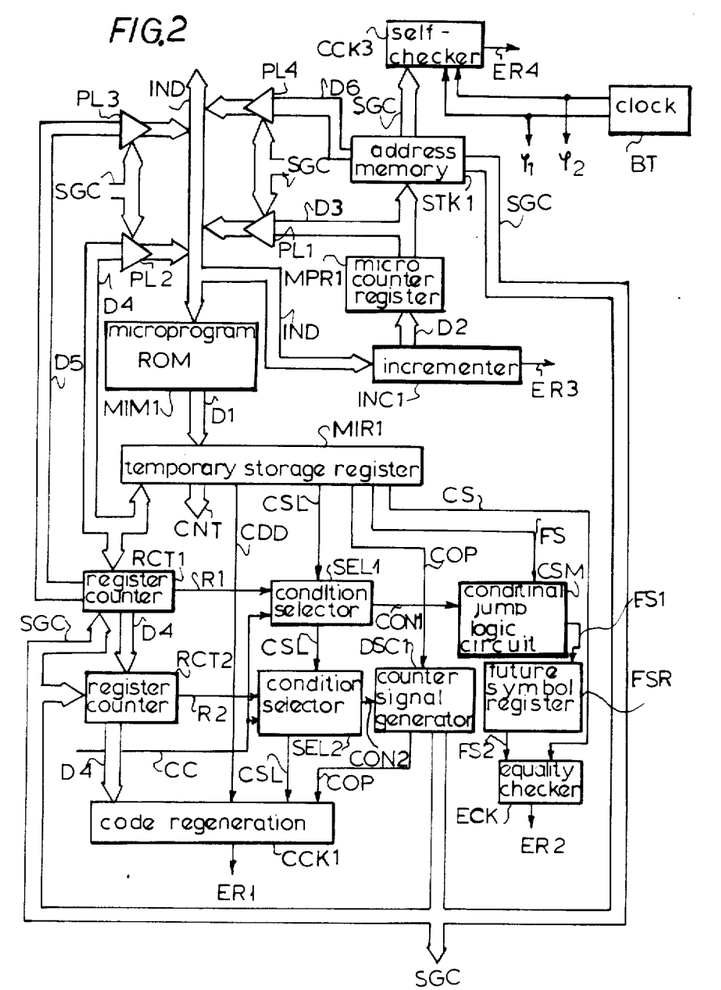
FIG. 2 is a block diagram of the control unit of FIG. 1, modified in accordance with the present invention in order to render it self-checking with on-line error detection capability.

At each microinstruction cycle, the future check symbol FS is temporarily stored in a register called the future symbol register FSR (FIG. 2). During the subsequent cycle the register contents are compared with symbol CS of the current microinstruction. A possible difference signals the presence of an error.

Check symbols are the encoding of microinstruction addresses in the Modified Berger code, which is the binary encoding of the difference between the number of zeroes present in the field to be coded and the minimum number of zeroes a valid word of the same field can contain. The choice of a modified Berger code is justified for these reasons:

Berger codes can detect unidirectional errors, thus covering the failures occurring in data transmission;

Berger codes are systematic: check bits are separated from information bits; and A Modified Berger code allows a considerable reduction of the number of check bits, as compared with a normal Berger code, to the detriment of a non-significant reduction of useful address space.

The number N of n-bit words containing k zeroes ($0 \leq k \leq n$) is given by the following binomial formula:

$$N = \binom{n}{k}$$

Number N is minimum when $k=0$, $k=1$, and is maximum for $k=n/2$. If a 4 k-word memory is available and if the addresses associated with a Berger code value lower than 2 or higher than 10 (in binary code) are eliminated, the result will be a 3.86% reduction in the address space (158 words out of 4,096), with respect to a 25% reduction in the coding bit number (3 instead of 4).

To be able to detect destination errors while executing two-branch conditional jumps, jump destination addresses are chosen such that their check symbols are related to each other by a simple logic relationship. In the non-limiting example of embodiment described here, the encoding of an address is chosen as a one's complement of the encoding of the other.

A circuit is then introduced which inverts the logic level of the bits of symbol FS and which is driven by the condition bit of the jump microinstruction.

To detect the destination errors in multi-branch conditional jumps, the jump destination addresses are chosen, in the non-limiting example described here, so as to have the same check symbol, since it is seldom that an error in the field "destination address" will give rise to a check symbol of another accepted destination address (i.e. having the same check symbol).

As a consequence some constraints are introduced in the microinstruction allocation in the memory:

the addresses with too high or too low Berger codes are not used; and the allocations of jump destination microinstructions, meeting the above conditions on the check symbols, are satisfied.

Still in accordance with the present invention, the other types of non-unidirectional errors already examined are detected by particular circuit arrangements such as those described hereinafter in connection with FIG. 2.

In FIG. 2 a ROM microprogram memory MIM is provided with a capacity which exceeds that of memory MIM of FIG. 1 with an equal microprogram to take into account the dimensions of the microinstructions which comprise now the two additional fields CS, FS. Memory MIM1 can be implemented with a known method as described by instance in the article by M. Nicolaidis "Evaluation d'une partie controle autotestable pour le MC 68000", Laboratoire d'Informatique et de Mathématiques Appliquées de Grenoble, RR No. 419, January 1984.

In this way internal failures of MIM1 cause at its outputs only unidirectional errors.

The temporary storage register MIM1 is a register similar to the register MIR of FIG. 1 adapted to temporarily store the microinstructions arriving from the microprogram read on a memory MIM1 on bus D1.

A conditional jump logic circuits performs the simple logic function relating the codes of conditional jump destination addresses.

The conditional jump logic circuit CSM can consist of a common driven inverter which receives the bits of the field of future check symbol FS, carried on the homonymous bus. Based on the logic level of the control signal on wire CON1, CSM emits again into bus FS1 the bits of bus FS with a logic level inverted or non inverted depending on which of the two destinations of a conditional jump is to be chosen.

The register FSR denotes a normal register storing, for a microinstruction duration, future check symbol FS, inverted or non inverted present on bus FS1 and emits the future check symbol again onto bus FS2 concurrently with the presence on bus CS of the current check symbol of the next microinstruction.

Buses FS2 and CS are connected to a self-checking equality checker ECK, capable of detecting both inequalities in the values of the symbols present on the two input buses, originated by failures which or errors occurred upstream, and possible failures may have occurred inside it. Equality checker ECK emits on connection ER2 the possible error signal.

The structure of block ECK is basically known. It can be implemented as described in the paper of D. A. Anderson: "*Design of Self-Checking Digital Networks Using Coding Techniques*" Coordinated Science Laboratories, University of Illinois, Report R-527, September 1971.

The bits of one of the two input fields are complemented and hence, associated with the corresponding bits of the other field, they make up corresponding bit pairs belonging to a 1-out-of-2 code which takes pairs 10 and 01 as valid, and pairs 11, 00 as invalid.

The circuit is basically of the combinatory type and supplies also at the output on connection ER2 a pair of bits belonging to the 1-out-of-2 code in a valid combination if all the pairs of input bits are valid. A failure in the circuit transforms the output bit pair into an invalid combination. Of course the error signalling will consist of a bit pair of equal logic value on ER2. An example of implementation circuit of equality checker ECK will be described in connection with FIGS. 7 and 8.

Blocks CSM, FSR, ECK form the circuit for checking the correct microinstruction sequencing.

A control signal generating circuit DSC1, functionally similar to the circuit DSC of FIG. 1, receives the operative code on bus COP and the condition bit on wire CON2 and emits control signals on bus SGC. Control signal generator DSC1 can be a two-level programmable logic array (PLA). In particular, by adopting a determined coverage of the truth table giving the outputs versus the inputs, any failure occurring at its inputs or inside it gives rise to a unidirectional error at its outputs.

This approach is described in the paper by G. P. Mak et al. "*The design of PLAs with concurrent error detection*", Proceedings of the 12th International Symposium on Fault-Tolerant Computing, Santa Monica, Calif., June 1982.

The lines of input bus COP "cross" the matrix of first-level AND gates and are connected to a code regenerator block CCK1. These lines, inside block DSC1, form the rows (or columns) of the first-level matrix and cross the lines of an internal bus belonging to another layer of the integrated circuit forming the respective matrix columns (or rows), at whose cross points AND gates are formed by MOS transistors.

Once the function is known which relates the inputs and outputs of the control signal generator DSC1, and which depends on the particular control unit, anyone skilled in the art can implement the circuit DSC1.

Register counter RCT and condition selector SEL of FIG. 1 are duplicated and represented in FIG. 2 by register counter RCT1, RCT2 and condition selectors SEL1, SEL2.

Register counters RCT1, RCT2 are connected to buses SGC and IND. Bus IND "crosses" register counters RCT1 and RCT2 and is connected to code regenerator block CCK1.

Register counters RCT1 and RCT2 emit possible end-of-count signals: R1 towards block SEL1, and R2 towards block SEL2.

At condition selectors SEL1, SEL2 there arrive condition selection code on bus CC from the outside and a condition selection code on bus CSL from microinstruction register MIR1; also bus CSL "crosses" condition selectors SEL1, SEL2 and is also carried to block CCK1.

The condition bit emitted by condition selector SEL1 is sent to block CSM, while that emitted by condition selector SEL2 is sent to block the control signal generator DSC1, as mentioned.

When blocks register counter RCT1, RCT2 operate as registers, possible internal failures generate unidirectional errors at their respective outputs on buses D5 and D4, detected either by the circuit for checking the correct microinstruction sequencing or by block CCK1.

However, when register counters RCT1, RCT2 operate as counters, data stored therein are not addresses and hence cannot be checked as in the preceding case; hence to check counting errors blocks RCT and SEL are duplicated. The check is not implemented by direct comparison of the contents of the two duplicated counters contents, but by using end-of-count signals R1, R2 for two different aims (R1 is connected through condition selector SEL1 as a command to inverter CSM; R2 is connected through SEL2 as a condition bit to the control signal generator block DSC1). If one of the counters fails, a conditional jump destination error occurs, detected by the check circuit of correct microinstruction sequencing. An error in the microinstruction contents is not detectable either by the sequencing check circuit, or by the duplication of the blocks just examined.

An additional field is thus introduced into the microinstruction encoding the microinstruction itself.

This additional field can be, for example, a parity check bit, or the original Berger code of all the microinstruction fields which are used inside the control unit; in our case, the field of the check signals connected to bus CNT is excluded because it is intended for circuits outside the unit and hence is checkable externally thereof.

The additional encoding field of each microinstruction is supplied through bus CDD to code regeneration block CCK1 operating as a self-checking microinstruction checker.

Circuit CCK1 is a circuit for regenerating the chosen microinstruction code, of basically known struction, which receives the microinstruction fields present in temporary storage register MIR1 through buses IND, CSC, COP, and locally regenerates the microinstruction code which is then compared with the value present on bus CDD in a self-checking checker of the ECK type, present in code regeneration circuit CCK1. The comparison result is a pair of bits belonging to a 1-out-of-2 code emitted on connection ER1 and signalling a possible error in the microinstruction contents.

The microprogram counter incrementer INC1 differs from block INC of FIG. 1 because it is self-checking. Dependant on its particular implementation, which will be described in detail hereinafter in connection with FIGS. 3 and 4, if an internal failure occurs, which gives rise to a non-unidirectional error, said error propagates until it arrives outside on connection ER3 by a signalling consisting of a pair of bits in 1-out-of-2 code.

Microprogram counter incrementer INC1 receives the address to be incremented on bus IND, and reemits it incremented on bus D2 to the microprogram counter register MPR1.

Register MPR1, basically similar to MPR of FIG. 1, receives the addresses from incrementer INC1 on bus D2 and reemits them on bus D3.

A stack-point address memory STK1 operationally similar to memory STK (FIG. 1), receives the addresses from bus D3 and will be described in greater detail in connection with FIGS. 5 and 6.

The address memory STK1 thus receives on bus D3 the addresses to be stored and reemits them on bus D6 on the basis of the control signals it receives on bus SGC. To detect failures on bus SGC which generate non-unidirectional errors at outputs of the address memory STK1, the lines of this bus are connected, after having "crossed" memory STK1, to selfchecking checker block CCK3 which emits on connection ER4 a pair of bits in 1-out-of-2 code which give a possible error signal.

The selfchecking checker CCK3 will be described in connection with FIG. 5.

A conventional time-base generating clock BT supplies the clock signals for the unit of FIG. 2.

As MOS technology is used, the clock signals consist of a two-phase signal $\phi 1$, $\phi 2$ which is carried to the sequential circuits of the unit in a known way and hence is not shown in FIG. 2 for the sake of simplicity. The clock signal is also carried to the selfchecking circuit CCK3.

As to the operation of the unit of FIG. 2, this is completely equivalent to that of the unit of FIG. 1 for the generation of the addresses and control signals.

The additional error checking functions will be examined hereinafter.

Error signal ER1, ..., ER4 can be fed to a higher-level controller which processes them and makes suitable decisions.

Figure 3:
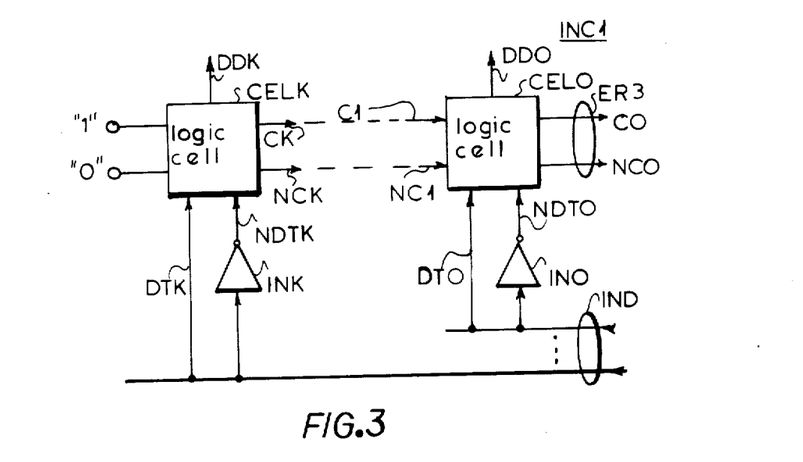
FIG. 3 is a circuit diagram of circuit INC1 of FIG. 2.

FIG. 3 is a block diagram of the self-checking incrementer INC1 of FIG. 2. This circuit comprises a series of K equal cells CELK, ... CELk, ... CEL0, where K (K>k>0) is the size of input and output buses IND and D2 of INC1.

Bits DTK, ... DTO of the corresponding lines of bus IND, carry signals CK, ... CO and corresponding inverted signals NCK, ... NCO from upstream cells arrive at the K cells.

A logic "1" as a carry signal and a logic "0" are carried to cell CELK of the most significant position. In this way the circuit INC1 increments by a unit the values present on bus IND.

Also inverted values NDTK, ... NDTO of the bits present on bus IND, obtained by corresponding inverters INK, ... INO connected to the corresponding lines of IND, arrive at the K cells.

Lines DDK, ... DDO of bus D2 outgo from said cells.

The inputs of cells of FIG. 3 consist then of bit pairs in 1-out-of-2 code.

Boolean functions relating the cell inputs and outputs are the same for all the cells. For cell CEL0 of the least significant position, the Boolean functions are as follows $$CO = \overline{NCI + NDTO \cdot CI} \qquad (1)$$

$$NCO = \overline{CI \cdot (DTO + NCI)}$$

$$DDO = \overline{DTO \cdot CI + NDTO \cdot NCI}$$

Figure 4:
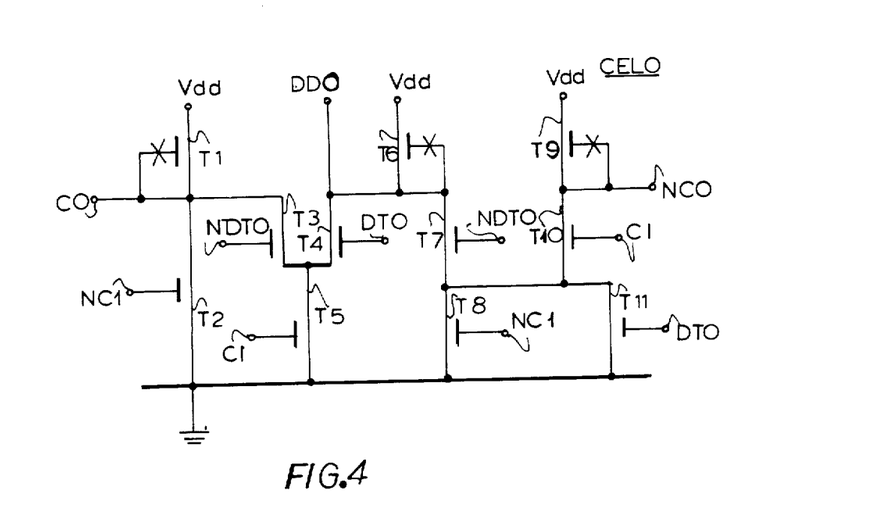
FIG. 4 is a circuit diagram of block CELO of FIG. 3.

FIG. 4 shows a circuit for one of cells CELk of FIG. 3, e.g. cell CEL0 implementing Boolean functions (1).

T1, T2, ... T11 represent MOS transistors, of which T1, T6, T9 are of the depletion type, and remaining transistors are of the enhancement type.

Transistor T1 has the drain connected to supply voltage Vdd, gate and source connected together and to the drains of transistors T2 and T3 from which the carry signal CO is extracted.

The source of transistor T2 is grounded, the source of transistor T3 is connected to the drain of transistor T5 and the source of transistor T4. The source of transistor T5 is grounded.

Signal NDTO is carried to the gate of transistor T3 and the signal DTO is applied to the gate of the transistor T4 while the signal CI is applied to the gate of transistor T5.

Supply voltage Vdd is fed to the drain of the transistor T6. The gate and source of transistor T6 are connected together and to the drains of transistors T4 and T7, wherefrom output signal DDO is extracted. The source of transistor T7 is connected to the drains T8 and T11 and to the source of transistor T10. The source of transistors T8 and T11 are grounded. Supply voltage Vdd is connected to the drain of transistor T9, while the gate of transistor T9 and its source are connected together and to the drain of transistor T10 from which signal NCO is extracted.

Signals NDTO, NC1, C1, DTO are respectively sent to the gates of transistors T7, T8, T10, T11.

The circuit of the Figure is subdivided into four branches, the two left branches, comprising transistors T1, ..., T5, generate carry signal CO, while the two right branches completely independent of the two other branches, generate signal NCO. The two central branches (transistors T4, ... T8) generate output signal DDO.

Each of the output signals CO, NCO, DDO is obtained from the combination of all four input signals C1, NC1, DTO, NDTO, in accordance with Boolean equations (1), but signals CO, NCO are extracted independently of each other, so that a failure in one of the two circuit parts alters only the corresponding generated signal and not the other one, giving rise to a non-valid pair of bits in 1-out-of-2-code on outputs CO, NCO.

Non-valid bit pairs on inputs C1, NC1 due to failures upstream cell CEL0, give still rise to a non-valid pair of bits on outputs CO, NCO.

Non-valid pairs of bits on inputs DTO, NDTO due to failures on bus IND or in inverter INO (FIG. 3) solely alter output signal DDO so as to generate a unidirectional error on bus D2 (FIG. 2).

As to failures in a generic cell CELk which give rise to arithmetical errors, i.e. errors affecting also the carry lines giving rise to non-valid bit pairs, the error propagates along the carry lines up to the last cell CEL0 giving rise to a non-valid bit pair on its outputs CO, NCO forming connection ER3 (FIG. 2), whereon there is present the respective signalling of arithmetic error.

However as to failures generating non-valid bit pairs on one of inputs DTK, . . . DTO, and NDTK, . . . NDTO, the error does not propagate to contiguous cells, but it gives only rise to a unidirectional error on output DD of the same cell.

Figure 5:
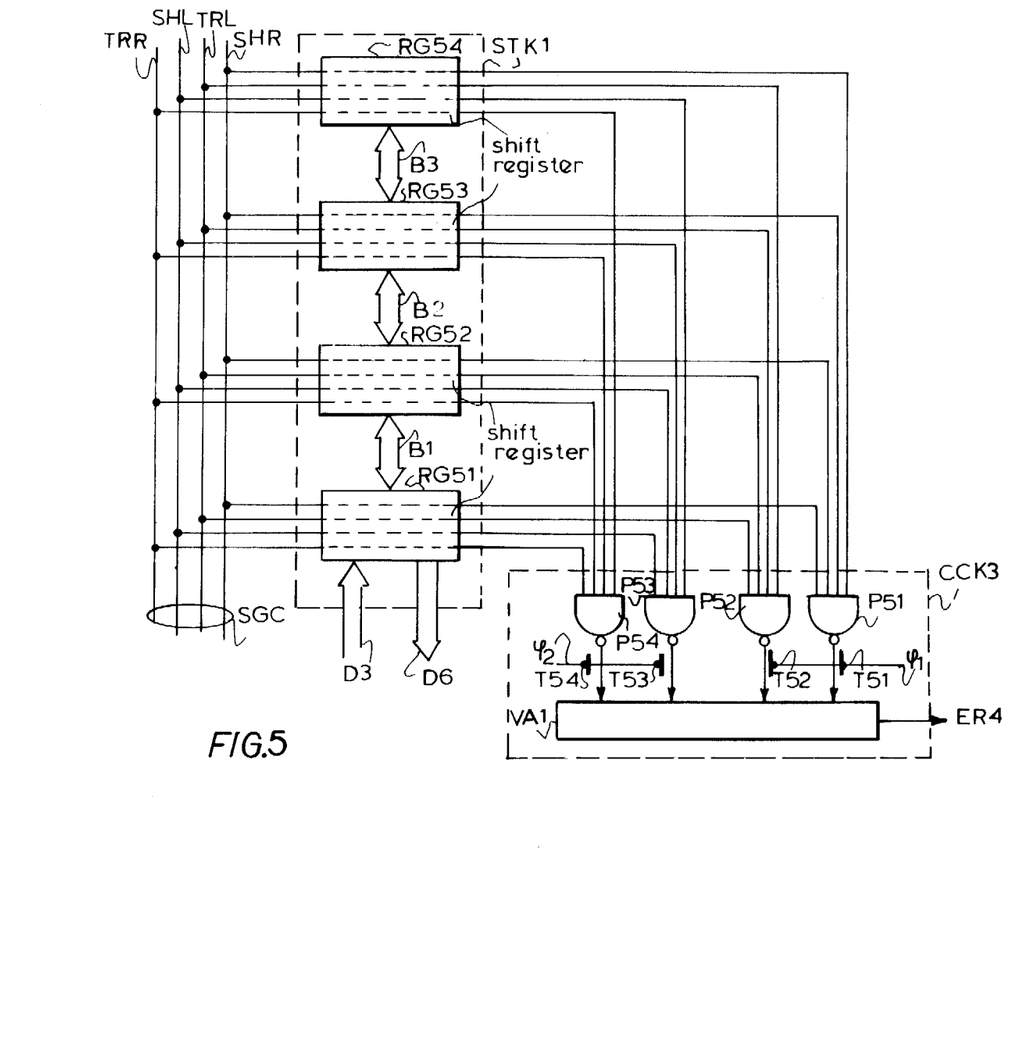
FIG. 5 is a circuit diagram of blocks STK1 and CCK3 of FIG. 2 and the interconnections between them.

FIG. 5 shows the structure of memory block STK1, delimited by the homonymous dotted line: it is composed of parallel-to-parallel bidirectional shift registers RG51, . . . RG54.

The shift does not occur inside a single register, but between cells of equal position of contiguous registers, through bidirectional buses B1, B2, B3 interconnecting said registers. Register RG51 supplies the addresses on bus D6 and receives addresses on bus D3.

The registers are composed of as many cells as there are lines of buses D3. An embodiment of one of the cells of said registers will be described with reference to FIG. 6.

In the non-limiting example herewith described there are provided 4 registers. Their number of registers determines the maximum nesting level of subroutines attainable.

Control signals of bus SGC determining data-shift are carried to each register cell with the already-described "crossing" technique.

In the non-limiting example herewith described there are provided the following four control signals:

SHR (SHL): down (up) data shift control
TRR (TRL): down (up) data transfer control Control signals SHR, TRL can be active only during phase $\phi 1$, while control signals SHL and TRR as active during clock phase $\phi 2$.

The bits of signals SHR and TRL, during phase $\phi 1$ intrinsically form a pair in 1-out-of-2 code; by contrast the bits of signals SHL and TRR form the pair during phase $\phi 2$. In fact if SHR (SHL) is active, TRL (TRR) isn't and vice versa.

Error checking circuit of bus SGC cannot be directly inserted onto the bus since possible failures beyond branching points towards block STK1 would not be detected, therefore also the lines crossing STK1 registers are to be checked.

That is done, by causing all the lines carrying control signals SHL, SHR, TRL, TRR to outgo from STK1 at the opposite end with respect to that at which they enter the register, towards self-checking checker CCK3, whose structure is shown within the homonymous dashed line.

All lines SHR are connected to corresponding inputs of gate P51; lines TRL to inputs of gate P52; lines SHL to gate P53, and lines TRR to gate P54. Gates P51, . . . P54 carry out the logic NAND function.

The outputs of P51 and P52 carry a bit pair in 1-out-of-2 code during phase $\phi 1$. Then said bits are passed towards the inputs of selfchecking checker block VA1 through MOS transistors T51, T52 whose gate is activated by clock signal $\phi 1$ (generated by BT, FIG. 2). When signal $\phi 1$ is not active further changes in the outputs of P51 and P52 do not affect signals at the inputs of VA1 since T51 and T52 are cut off.

The outputs of P53, P54 carry, on the contrary, a bit pair in 1-out-of-2 code during phase $\phi 2$. Said bits are let through the inputs of selfchecking checker block VA1 by means of MOS transistors T53, T54, whose base is activated by timing signal $\phi 2$.

Under failure absence conditions, valid bit pairs in 1-out-of-2 code will be always present at the inputs of selfchecking checker block VA1.

Figure 7:
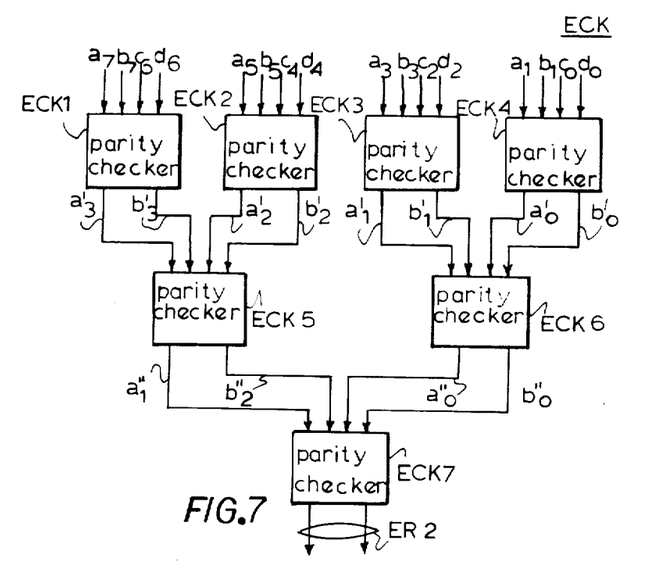
FIG. 7 is a block diagram of self-checking checker ECK of FIG. 2.

Block VA1 consists of a self-checking checker like ECK4 of FIG. 7. The output of checker VA1 is a bit pair in 1-out-of-2 code on connection ER4.

By the circuit arrangement of FIG. 5 a failure at any point of the lines of bus SGC determines the generation of a non-valid bit pair at the outputs of gates P51, P52, or even P53, P54, during the relevant phases $\phi 1$ or $\phi 2$, and an error signal on connection ER4 of checker VA1.

Figure 6:
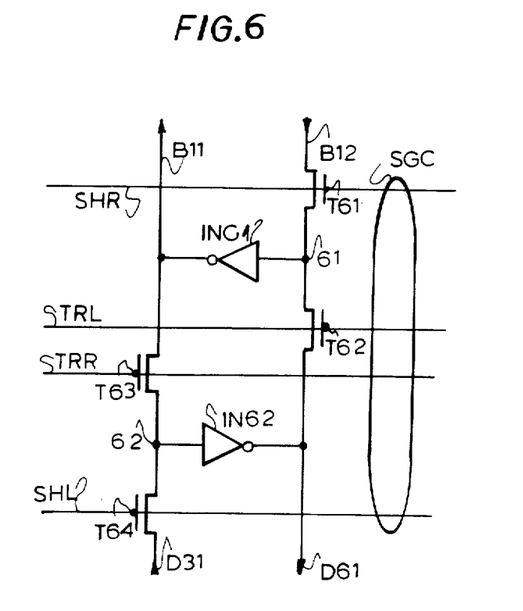
FIG. 6 is a circuit diagram of a register cell of block STK1 of FIG. 5.

FIG. 6 shows the structure of a basic cell of the registers of block STK1, e.g. the first cell of register RG51 (FIG. 5).

SHR, TRL, TRR, SHL denote the line trunks of bus SGC passing inside the cell, while B11, B12 denote the first two lines of bidirectional bus B1 (FIG. 5), and D31 and D61 the first two lines of bus D3, D6 (FIG. 5), respectively.

Lines D31 and B11 are interconnected through the channel of MOS transistor T64, internal line 62 and the channel of MOS transistor T63. Lines B12 and D61 are interconnected through the channel of MOS transistor T61, internal line 61 and the channel of MOS transistor T62.

Lines SHR, TRL, TRR, SHL are connected to the gates of transistors T61, T62, T63, T64 respectively, and supply them with the conduction enabling signals.

An inverter IN61 is inserted between lines 61 and B11, and an inverter IN62 between lines 62 and D61.

The activation of the lines of bus SGC allows the data transfer, in the directions indicated by arrows in the Figure, through transistors T61, . . . T64. More precisely, upon SHR and TRR activation, datum present on B12 passes through transistor T61 on line 61, then, through inverter IN61, transistors T63 and inverter IN62, it arrives on line D61 (meanwhile transistors T62 and T64 are cut off). By contrast, contrary upon activation of SHL and TRL the datum present on D31 passes through transistor T64 on line 62, then, through inverter IN62, transistor T62 and inverter IN61 it arrives on line B11 (meanwhile transistors T61 and T63 are cut off).

FIG. 7 shows the block diagram of the self-checking parity checker ECK of FIG. 2. ECK is composed of a determined number of equal circuit blocks ECK1, . . . ECK7 with four inputs and two outputs binary-tree connected.

The number of said blocks is determined by the number of input bus lines to the parting check block ECK input bus line.

In the nonlimiting example here described ECK input buses FS2 and CS are composed of eight lines, respectively $a_7, \ldots a_0$ and $b_7, \ldots b_0$.

The lines with equal index in the two buses form a corresponding number of pairs which are carried to the inputs of ECK blocks of the first tree level (ECK1, . . . ECK4); each block receives two pairs of lines. Each pair of lines must carry bits in 1-out-of-2 code; hence the bits of one of the two input buses FS2 and CS, which under normal conditions carry the same information, unless already intrinsically complemented, must be complemented by means of suitable inverters, before being supplied to ECK.

Each internal block of ECK supplies to the output a pair of bits in 1-out-of-2 code which is valid if the two bit pairs at its inputs are valid.

Each pair of higher level blocks has its outputs connected to a lower-level block; in FIG. 7 the outputs of ECK1 and ECK2 ($a'_3$, $b'_3$; $a'_2$, $b'_2$) are carried to the inputs of ECK5; the outputs of ECK3 and ECK4 ($a'_1$, $b'_1$; $a'_0$, $b'_0$) to the inputs of ECK6; the outputs of ECK5 and ECK6 ($a''_1$, $b''_1$; $a''_0$, $b''_0$) to the inputs of ECK7 to whose outputs the pair of lines forming connection ER2 is present.

A non-valid bit pair at any point of ECK generates a non-valid bit pair at the output on connection ER2.

Figure 8:
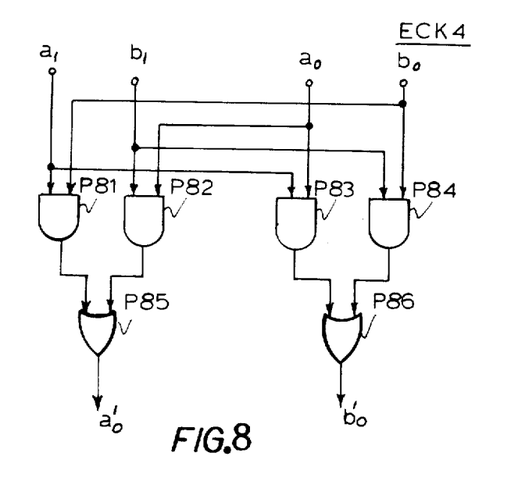
FIG. 8 is a circuit diagram of one of the blocks of FIG. 7.

FIG. 8 shows an example of embodiment of one of the internal blocks of ECK, e.g. the block ECK4.

ECK4 is composed of four AND gates P81, ... P84 and two OR gates P85 and P86, and receives two line pair carrying bits in 1-out-of-2 code denoted by $a_1$, $b_1$, and $a_0$, $b_0$.

Line $a_1$ is connected to an input of P81 and P83; $b_1$ to an input of P82 and P84; $a_0$ to an input of P82 and P83; $b_0$ to an input of P81 and P84. The outputs of P81 and P82 are connected to the inputs of P85, and those of P83 and P84 to the inputs of P86.

The outputs $a'_0$, $b'_0$ of P85 and P86 form a bit pair in 1-out-of-2 code.

Modifications and variations can be made to the embodiment described, without departing from the scope of the invention.

E.g. the self-checking checker CCK3 of FIG. 5 can be modified in this way: since the outputs of gates P51, ... P54 on the whole carry sets of four bits in 3-out-of-4 code (at each instant three of them are at active logic level), then the insertion of transistors T51, ... T54 can be avoided, and block VA1 can be replaced by a so-called "Berger checker", already known in the art, which indeed checks whether said sets of four bits, applied to the inputs, belong to the 3-out-of-4 code.

We claim:

1. An MOS selfchecking microprogram control unit with on-line error detection, comprising:

a microinstruction memory (MIM1) generating at an output thereof in the event of a failure only unidirectional errors, said microinstruction memory containing microinstructions each containing, in addition to a microinstruction datum field, two further fields consisting respectively of a current address code (CS) of a position in the microinstruction memory (MIM1) at which the microinstruction is physically contained and a future address code (FS) of a position in the microinstruction memory (MIM1) at which the next microinstruction is physically contained, said microinstructions including conditional-jump microinstructions being allocated in said microinstruction memory (MIM1) with codes related to one another by gating logic relationships and determining jumps to respective addresses according to a value of a variable;

a temporary storage microinstruction register (MIR1) connected to said output of said microinstruction memory (MIM1);

a first register counter (RCT1) connected to said temporary storage microinstruction register (MIR1);

a second register counter (RCT2) connected to said first register counter (RCT1);

a first condition selector (SEL1) connected to said temporary storage microinstruction register (MIR1) and to said first register counter (RCT1);

a second condition selector (SEL2) connected to said second register counter (RCT2) and to said first condition selector (SEL1);

a programmed-logic-array control signal generator (DSC1) having an input connected to an output of said temporary storage microinstruction register (MIR1) and generating in the event of failure only unidirectional errors at outputs of the programmed-logic-array control signal generator, said programmed-logic-array control signal generator (DSC1) being connected to said temporary storage microinstruction register (MIR1) and to said second condition selector (SEL2);

a microprogram counter comprising an incrementer (INC1) connected to said microinstruction memory (MIM1) and a microprogram counter register (MPR1) connected to said incrementer (INC1), said incrementer (INC1) and said microinstruction memory (MIM1) receiving external inputs through a bus (IND);

a temporary address memory (STK1) of stack-point addresses of a main instruction sequence having an input connected to an output of said microprogram counter register (MPR1), said temporary address memory (STK1) including a first selfchecking equality checker (VA1) for checking results of operations on control signals for registers of the temporary address memory (STK1), said temporary address memory (STK1) having an output connected to said bus (IND);

a code-regeneration selfchecking microinstruction checker (CCK1) connected to said second register counter (RCT2), to said second condition selector (SEL2), to said programmed-logic-array control signal generator (DSC1) and to said temporary storage microinstruction register (MIR1);

means connected to said temporary storage microinstruction register (MIR1) and responsive to said current address code (CS) and said future address code (FS) and controlled by said first condition selector (SEL1) for comparing a current address code (CS) of a particular microinstruction from said temporary storage microinstruction register (MIR1) with a future address code (FS) from a prior microinstruction from the temporary storage microinstruction register (MIR1) delayed by a microinstruction time and present in the prior microinstruction modified by said logic relationships as determined by said first condition selector (SEC1) and emitting a first error indication (ER2) upon a discrepancy in the comparison to effect a self-check of jump microinstruction;

said incrementer (INC1) being connected to and receiving inputs from said bus (IND) being constructed to generate upon possible circuit failures only unidirectional errors on address outputs to said microprogram counter register (MPR1) in the event of failures at address inputs thereto and to output a second error indication (ER3) upon development of arithmetical errors involving internal carry signals; and means for applying control signals generated by said programmed-logic-array control signal generator (DSC1) to said temporary address memory (STK1) of stack-point addresses whereby said temporary address memory (STK1) is controlled by the control signals received from said programmed-logic-array control signal generator (DSC1) and which are carried to said first selfchecking equality checker (VA1) emitting a third error indication (ER4) upon a failure of the control signals from said programmed-logic-array control signal generator (DSC1), said code-regeneration selfchecking microinstruction checker (CCK1) generating a microinstruction code from words passed from said temporary storage microinstruction register (MIR1) through said register counters (RCT1) and (RCT2), and from control signals from said temporary storage microinstruction register (MIR1), said second condition selector (SEL2) and said programmed-logic-array control signal generator (DSC1) and comparing the thus-generated microinstruction code with a microinstruction code contained in the microinstruction emitted by said temporary storage microinstruction register (MIR1) to emit a fourth error signal (ER1) upon a comparison discrepancy.

2. A microprogram control unit as defined in claim 1, wherein said current and future address codes (CS, FS) are a modified Berger code of an microinstruction address field.

3. A microprogram control unit as defined in claim 2 wherein said gating logic relationships are a logic complement in case of two-branch conditional jumps, and a logic equality in case of multi-branch conditional jumps.

4. A microprogram control unit as defined in claim 3 which comprises:
- a conditional jump logic circuit (CSM) having an input connected to an output of said temporary storage microinstruction register (MIR1) and to an input connected to an output of said first condition selector (SEL1), and controlled by the output of said first condition selector (SEL1), which generates said gating logic relationships and applies them to a future address code (FS) it receives from said temporary storage microinstruction register (MIR1);
- a further register (FSR) having an input connected to said output of said conditional jump logic circuit (CSM) storing for a microinstruction time period the words it receives from said conditional jump logic circuit (CSM); and
- a second selfchecking equality checker (ECK) having an input connected to an output of said further register (FSR) and an input connected to an output of said temporary storage microinstruction register (MR1) for comparing the words of said further register (FSR) and of current address code (CS), and, in case of difference, emitting said first error indication (ER2).

5. A microprogram control unit as defined in claim 4 wherein said conditional jump logic circuit (CSM) which generates said gating logic relationships is a logic inverter driven by said first condition selector (SEL1).

6. A microprogram control unit as defined in claim 4 wherein the inputs and the outputs of said first and second selfchecking equality checkers (VA1, ECK), the output of said code-regeneration selfchecking microinstruction checker (CCK1), the address inputs and carry lines of said incrementer (INC1) carry bit pairs in a 1-out-of-2 code.

7. A microprogram control unit as defined in claim 1 wherein said incrementer (INC1) consists of a series of equal cells (CELK, . . . CELk, . . . CELO) which receive the bits (DTK . . . DTO) of corresponding lines of an address bus (IND) of the microinstruction memory (MIM1) on respective address inputs, the complemented values (NDTK, . . . NDTO) of said bits, obtained through logic inverters (INK, . . . INO) directly connected onto said lines, said cells supplying a downstream one of said cells with internal carry signals (CK, . . . , CO) and their complemented value (NCK, . . . NCO) obtained by internal circuits independent of each other, and an output signal (DDK, . . . DDO) on said address outputs, each cell (CELk) carrying out the following Boolean functions:

$$CK = \overline{NC(k + 1) + NDTk \cdot C(k + 1)}$$

$$NCK = \overline{C(k = 1) \cdot [DTk + NC(k = 1)]}$$

$$DDK = \overline{DTk \cdot C(k = 1)} + NDTk \cdot NC(k + 1)$$

carry signal (CO) and its inverted value (NCO) of the cell (CELO) of the last position forming also said second error indication (ER3).

8. A microprogram control unit as defined in claim 7 wherein each of said cells (CELk, . . . CELO) is implemented by a first to an eleventh MOS transistor (T1 to T11) with respective sources, drains and gates, connected as follows: T1 drain is connected to a supply voltage Vdd, gate and source are connected together and to the drains of T2 and T3 wherefrom said output carry signal (CK . . . CO) is extracted; T2 source is grounded; T3 source is connected to T5 drain and to T4 source, and T5 source is grounded; said complemented value (NDTK, . . . NDTO) is sent to T3 gate, the bit of said address bus (DTK, . . . DTO) to T4 gate, and the input carry signal to T5 gate; said supply voltage Vdd to T6 drain, while gate and source are connected together and to T4 and T7 drain wherefrom said output signal (DDK, . . . DDO) is extracted; T7 source is connected to T8 and T11 drains and to T10 source; T8 and T11 sources are grounded; said supply voltage Vdd is connected to T9 drain, while T9 gate and source are connected together and to T10 drain wherefrom said complemented carry signal (NCK, . . . NCO) is extracted; the input carry signal and its complement, the bits of input address bus (IND) and their complements are carried to T10, T8, T11, T7 gates respectively; said transistors T1, T6, T9 being of the enhancement type, the others of the depletion type.

9. A microprogram control unit as defined in claim 1 wherein said temporary address memory (STK1) is composed of registers (RG51, . . . RG54) of the parallel-to-parallel type with bidirectional shift between contiguous registers, and in that each of said registers is controlled by said control signals, and in that equal control signals of different registers are carried to inputs of NAND gates (P51, . . . P54) whose outputs are inputs of said selfchecking first equality checker (VA1).

* * * * *